United States Patent [19]

Fujiwara

[11] Patent Number: 5,475,648
[45] Date of Patent: Dec. 12, 1995

[54] REDUNDANCY SEMICONDUCTOR MEMORY DEVICE WHICH UTILIZES SPARE MEMORY CELLS FROM A PLURALITY OF DIFFERENT MEMORY BLOCKS, AND UTILIZES THE SAME DECODE LINES FOR BOTH THE PRIMARY AND SPARE MEMORY CELLS

[75] Inventor: Atsushi Fujiwara, Kyoto, Japan

[73] Assignee: Matsushita Electric Industrial Co., Ltd., Osaka, Japan

[21] Appl. No.: 13,382

[22] Filed: Feb. 4, 1993

[30] Foreign Application Priority Data

Feb. 7, 1992 [JP] Japan .................................. 4-022298

[51] Int. Cl.⁶ ............................................. G11C 7/00
[52] U.S. Cl. ............... 365/230.06; 365/200; 365/230.03; 371/10.3
[58] Field of Search ......................... 365/200, 230.03, 365/225.7, 230.06; 371/10.2, 10.3, 10.1

[56] References Cited

U.S. PATENT DOCUMENTS

| | | | |
|---|---|---|---|
| 4,656,610 | 4/1987 | Yoshida et al. | 365/200 |
| 4,860,260 | 8/1989 | Saito et al. | 365/201 |
| 4,908,798 | 3/1990 | Urai | 365/230.03 |
| 5,021,944 | 6/1991 | Sasaki et al. | 365/200 |
| 5,126,973 | 6/1992 | Gallia et al. | 365/200 |
| 5,224,073 | 6/1993 | Nakayama | 365/200 |
| 5,243,570 | 9/1993 | Saruwatari | 365/201 |
| 5,255,227 | 10/1993 | Haeffele | 365/200 |
| 5,257,229 | 10/1993 | McClure et al. | 365/200 |
| 5,270,976 | 12/1993 | Tran | 365/200 |
| 5,295,101 | 3/1994 | Stephens, Jr. et al. | 365/200 |
| 5,307,316 | 4/1994 | Takemae | 365/200 |

FOREIGN PATENT DOCUMENTS

| | | |
|---|---|---|
| 62-125598 | 6/1987 | Japan . |
| 1-112598 | 5/1989 | Japan . |
| 2-113490 | 4/1990 | Japan . |

*Primary Examiner*—David C. Nelms
*Assistant Examiner*—Andrew Q. Tran
*Attorney, Agent, or Firm*—Willian Brinks Hofer Gilson & Lione

[57] ABSTRACT

A semiconductor memory device with a redundancy configuration with a higher corrective efficiency is disclosed. Primary memory cell arrays 3a, 3b, and 3c are arranged in memory cell blocks a, b, and c. Spare memory cell arrays 2b and 2c are arranged in the memory cell blocks b and c. When the address of an address signal supplied agrees with the address of a defective primary memory cell in one memory cell block, a spare memory cell in the other memory cell block selected for such a defective memory cell. Even if a word line of the primary and a word line of the spare memory cells are selected at the same time, it is possible to access read data in a nondestructive manner. This achieves a high-speed word line activation as well as an improved corrective efficiency. The provision of a row decoder that connects a primary word line to a spare word line with a shared decode line prevents the increase of the area of memory chips due to the arrangement of a spare memory cell.

9 Claims, 11 Drawing Sheets

(a) PRIOR ART (b) PRESENT INVENTION

REDUNDANCY SEMICONDUCTOR MEMORY DEVICE WHICH UTILIZES SPARE MEMORY CELLS FROM A PLURALITY OF DIFFERENT MEMORY BLOCKS, AND UTILIZES THE SAME DECODE LINES FOR BOTH THE PRIMARY AND SPARE MEMORY CELLS

BACKGROUND OF THE INVENTION

This invention relates to an improvement in semiconductor memory devices with a redundant configuration to electrically provide a corrective for defective bits.

The storage capacity of semiconductor memory devices has been increased. The number of components per memory chip has been increased. The area of the memory chip has been increased. If only defect-free memory chips are selectively used, this presents a disadvantage to manufacturing costs. This calls for a corrective technique with respect to a defective bit. It is known that a semiconductor memory device employs therein a redundant configuration in which besides a primary memory cell a spare memory cell is provided so that the spare memory cell will take over from the primary memory cell in the event of failure. Following the fabrication of the semiconductor memory device, primary memory cells are first checked for possible defect. Then, if a defective primary memory cell is found, it is replaced by a spare memory cell. Thus, storage capacitance to be achieved is satisfied.

A semiconductor memory device incorporating therein the foregoing redundant configuration is known from Japanese Patent Application, published under No. 1-112598. In accordance with this semiconductor memory device, primary memory cells and spare memory cells (i.e., defect corrective memory cells) are organized in a matrix structure to form a memory cell array, and the primary memory cells are interconnected through word lines and bit lines while on the other the spare memory cells are connected together either with word lines or with bit lines, or with both the word and bit lines. The address of a defective primary memory cell is replaced by the address of a spare memory cell so that the defective memory cell is corrected. Japanese Patent Application, published under No. 62-125598, discloses a technique in which a first decoder circuit to select primary memory cells and a second decoder circuit to select spare memory cells are provided. The first decoder circuit is so organized that a plurality of logical circuits of current switching type are longitudinally stacked. During the defect corrective, a non-selective pulse voltage and a selective pulse voltage are applied to the first decoder circuit and the second decoder circuit respectively, making a defective primary memory cell non-selective and a spare memory cell selective at the same time. Additionally, U.S. Pat. No. 4,860,260, JP Patent Application, published under No. 2-113490, and JP Patent Application, published under No. 57-111893 disclose semiconductor memory devices incorporating a redundant configuration.

FIG. 9 illustrates a typical redundant configuration incorporated in the above-described conventional semiconductor memory device. Such a redundant configuration contains a sense amplifier array 1, a spare memory cell array 2, a primary (main) memory cell array 3, a primary row decoder 4A, a spare row decoder 4B, a row predecoder 5, a redundancy-use decision circuit 20, comprised of elements SD0 to SDn to store the addresses of defective memory cells and to decide whether an input address corresponds to the stored address, a column decoder 6, a data I/O buffer 7, and word lines WL0 to WLm of the primary memory cell array 3. Spare word lines of the spare memory cell array 2, indicated by SW0 to SWn, are selected by a signal from the redundancy-use decision circuit 20.

FIG. 10 shows how the primary row decoder 4A and the spare row decoder 4B are organized.

The operation of a memory readout in correcting a defective memory cell is now described. Here, it is assumed that the primary word line WL0 of the primary memory cell contains a defective memory cell, and that the word line WL0 is replaced by the spare word line SL0 of the spare memory cell.

When ADDRESS SIGNALS A0 to A1 are fed to the row predecoder 5 as well as to the redundancy-use decision circuit 20, the elements SD0 to SDn of the decision circuit 20 each make a comparison between the addresses of ADDRESS SIGNALS A0 to A1 supplied and their stored addresses of the defective memory cells. For example, if ADDRESS SIGNAL supplied happens to be an address corresponding to the primary word line WL0 of the primary memory cell array 3, this means that the address stored in the element SD0 of the decision circuit 20 agrees with the address of supplied ADDRESS SIGNAL. Then, REDUNDANCY-USE SIGNAL is sent out from the element SD0 of the redundancy-use decision circuit 20. This REDUNDANCY-USE SIGNAL is fed to the primary row decoder 4A as PRIMARY MEMORY STOP SIGNAL 18. Upon receiving STOP SIGNAL 18, the primary row decoder 4A stops operating thereby making the primary word line WL0 non-selective. REDUNDANCY-USE SIGNAL is also supplied to the spare row decoder 4B as REDUNDANCY-SELECTION SIGNAL SWP0 to select the spare word line SW0. This replaces the primary word line WL0 containing the defective memory cell with the spare word line SW0. In this way, the defective memory cell can be corrected.

Next, a conventional semiconductor memory device in which a plurality of memory cells are zoned to form memory cell blocks is described, which is shown in FIG. 11. In accordance with this semiconductor memory device, a memory cell block a (b, c, d) contains a sense amplifier array 1a (1b, 1c, 1d), a spare memory cell array 2a (2b, 2c, 2d), a primary memory cell array 3a (3b, 3c, 3d), a column decoder 6a (6b, 6c, 6d), a primary row decoder 4Aa (4Ab, 4Ac, 4Ad), a redundancy signal generating circuit 20a comprised of elements SDoa to SDna (20b comprised of elements SDob to SDnb, 20c comprised of SDoc to SDnc, and 20d comprised of elements SDod to SDnd), and a row predecoder 5 that is shared among the memory cell blocks. Only one of the memory cell blocks a, b, c, and d is selected by Al - 1,l of supplied ADDRESS SIGNALS A0 to A1 and is brought into operation. The operation of the memory cell blocks a, b, c, and d is the same as the one described in FIG. 8.

Both the conventional semiconductor memory devices of FIG. 9 and FIG. 11, however, require the provision of word lines for every memory cell block. Further, if a defective memory cell is found in a memory cell block, only a spare word line (i.e., a spare memory cell), arranged in the same memory cell block that the defective memory cell is contained, can provide a corrective for the defective memory cell. The size of memory increases with the number of memory cell blocks. This causes the number of spare word lines to increase in a memory chip. As component density per memory chip becomes higher, more complicated fabrication technique is required. Not only the number of spare word lines necessary for a single memory cell block, but also the number of decode lines used to select a spare word line increases. As the number of spare word lines increases, a greater chip area is required.

As the scale of integration becomes larger, the layout pitch of row decoders gets narrower. In order to reduce the pitch, one row decoder is provided for a plurality of word lines, and the word lines are selected by WORD LINE DRIVE SIGNAL, as shown in FIG. 10. In order to drive the spare word lines, the conventional semiconductor memory device additionally requires, besides a primary word line drive signal generation circuit 21A comprised of elements WD0 to WD3, a spare word line drive signal generating circuit 21B comprised of elements SWD0 to SWD3 corresponding to spare word lines SWo0 to SWo3. In this example, however, the spare word line drive signal generating circuit 21B requires four elements (i.e., the elements SWD0 to SWD3), since four spare word lines are provided. The number of spare word lines increases with the scale of integration, which presents a problem that the area of the memory chip disadvantageously increases.

SUMMARY OF THE INVENTION

Bearing the foregoing problems in mind, the present invention was made. It is a general object of the invention to improve the efficiency of corrective and to prevent the chip area from increasing due to the layout of the spare memory cell by making, even in cases where a defective memory cell occurs in one memory cell array that has no spare memory cells left, a spare memory cell in the other memory cell array available.

To accomplish the foregoing objects, the present invention proposes the following means.

A first means provides a semiconductor memory device which comprises a plurality of memory cell blocks each containing a plurality of memory cells, wherein: of the memory cells certain plural memory cells and all other plural memory cells are arranged so that the former memory cells serve as primary memory cells and the latter memory cells on the other hand serve as spare memory cells; and memory replacement means is provided which stores the address of a defective primary memory cell in one of the memory cell blocks and selects, when the address of an address signal supplied agrees with the address of a defective memory cell, a spare memory cell in the other memory cell block for the defective primary memory cell. Therefore, the defective memory cell corrective efficiency can be improved since a defective memory cell in one memory cell block can be replaced by a spare memory cell in the other memory cell block.

A second means provides a semiconductor memory device, wherein the memory replacement means is organized so that it can select a spare memory cell from a memory cell block containing therein a defective primary memory cell. Therefore, the spare memory cell availability can be improved since, when all spare memory cells in one memory cell block are used up, other spare memory cells in the other memory cell block become ready for further defective memory cell corrective.

A third means provides a semiconductor memory device, wherein all spare memory cells are arranged in one of the memory cell blocks. Therefore, this simplifies the organization of semiconductor memory devices.

A fourth mean provide a semiconductor memory device, wherein the spare memory cell is connected to the primary memory cell in the same memory cell block with a shared decode line and is driven through a shared word line drive signal generation circuit. Therefore, the area of a memory chip required can be reduced since the sharing of the word line drive signal generating circuit between the spare word line and the primary word line makes it possible to eliminate a need for the separate provision of such a circuit for both spare and primary word lines.

A fifth means provides a semiconductor memory device further including a decoder that individually drives word lines of the memory cells of each memory cell block; a redundancy-use decision circuit that stores in advance the address of a defective memory cell and outputs a redundancy-use signal if the address of an address signal agrees with the stored address; a predecoder that is responsive to an address signal and sends out a predecode signal to select a word line of the primary memory cell corresponding to the address of the address signal; and a decode signal selection circuit that connects a predecode signal, supplied from the predecoder, to the decoder of the memory cell block containing the primary memory cell corresponding to the address of the address signal while, when a redundancy-use signal is sent out from the redundancy-use decision circuit, connecting the redundancy-use signal to the decoder of the memory cell block containing therein a spare memory cell to be replaced. Therefore, this assures the smooth operation of the decoders of the memory cell blocks.

A sixth means provides a semiconductor memory cell device, wherein: the plurality of memory cell blocks are divided into two block groups; the spare memory cells are arranged in any one of the memory cell blocks of the two block group; if a primary memory cell of one of the two block groups is a defective memory cell, a spare memory cell of the other block group is previously assigned for replacement; and the decode signal selection circuit connects predecode signals to the decoders of one of the block groups which contains the primary memory cell corresponding to the address of the address signal, while connecting redundancy-use signals to the decoders of the other block group which contains the primary memory cell not corresponding to the address of the address signal. Therefore, even if word lines of both the primary and spare memory cells are selected, it is possible to access read data in a nondestructive manner to achieve a high-speed word line activation, an improved defective memory cell corrective efficiency, and an improved post-corrective yield.

A seventh means provides a semiconductor memory device further including a redundancy encoder that encodes a redundancy-use signal fed from the redundancy-use decision circuit to send out a redundancy decode signal to select a word line of a spare memory cell. Therefore, the number of signal lines used to decode a spare memory cell can be decreased even if many spare memory cells are provided, since on the way the output of the redundancy-use decision circuit is encoded by the redundancy encoder.

An eighth means provides a semiconductor memory device, the memory cell blocks are serially arranged and are divided into two block groups by a boundary defined between the two centrally located memory cell blocks; and the memory cell block containing the spare memory cells is positioned at the center. Therefore, this realizes a semiconductor memory device that has a long data hold time and a tougher noise-resistance since a memory cell block with a longer bit line length is arranged inside (for instance, arranged around the center of a memory chip where the variation in memory cell processing is less likely to appear compared to the outside).

A ninth means provides a semiconductor memory device, further including a sense amplifier that is shared between the adjoining memory cell blocks; and switching means for switching signal connection between the sense amplifier and the memory cell blocks at each sides of the sense amplifier. Therefore, the pitch of sense amplifiers can be reduced and the number of sense amplifiers can be reduced thereby greatly reducing the area of the chip.

A tenth means provides a semiconductor memory device further including stop signal output means that sends out, upon receiving a redundancy-use signal from the redundancy-use decision circuit, a primary memory stop signal to the decoder of a defective primary memory cell to stop its operation. Therefore, this eliminates a need for current used to get the primary word line activated thereby achieving lower power consumption.

An eleventh means provides a semiconductor memory device with a plurality of primary memory cells and a plurality of spare memory cells, the semiconductor memory device comprising: a decoder that is so configurated that the primary memory cell and the spare memory cell are interconnected by a shared decode line and driven through a shared word line drive signal generating circuit; and memory replacement means that stores in advance the address of a defective memory cell of the plurality of primary memory cells and makes, when the address of an address signal supplied agrees with the address of the defective memory cell, the decoder operate to select a spare memory cell for the defective primary memory cell. Therefore, this eliminates a need for the separate provision of a word line drive signal generating circuit for both spare and primary word lines.

A twelfth means provide a semiconductor memory cell wherein the memory replacement means includes: a redundancy-use decision circuit that stores in advance the address of a defective memory cell and outputs a redundancy-use signal if the address of an address signal agrees with the stored address; a predecoder that is responsive to an address signal and sends out a predecode signal to select a word line of the primary memory cell corresponding to the address of the address signal; and a decode signal switching circuit that connects a predecode signal, supplied from the predecoder, to the word line drive signal generating circuit, while connecting, when a redundancy-use signal is sent out from the redundancy-use decision circuit, the redundancy-use signal instead of the predecode signal to the word line drive signal generating circuit. Therefore, this makes the switching of selection between a word line of the primary memory cell and another of the spare memory cell smooth since, according to the presence or absence of a redundancy-use signal, the decode signal switching circuit performs switching between the predecode signal and the redundancy-use signal as the input of the drive signal generating circuit.

A thirteenth means provides a semiconductor memory device wherein the number of elements of the redundancy-use decision circuit and the number of decode lines of the word line drive signal generating circuit are even; and the word line drive signal generating circuit is directly decoded by a redundancy-use signal of the redundancy-use decision circuit. Therefore, this reduces the number of devices and wiring thereby reducing the area of the chip.

A fourteenth means provides a semiconductor memory device further including a redundancy encoder that encodes the output of the redundancy-use decision circuit to send out a redundancy decode signal that selects a word line of the spare memory cell. Therefore, it is possible to reduce the amount of wiring to decode the word line of the spare memory cell even if many spare memory cell are provided, since the redundancy-use signal is once translated into the redundancy decode signal that drives the word line of the spare memory cell.

BRIEF DESCRIPTION OF THE DRAWINGS

Other objects, features, and advantages will become more apparent to those skilled in the art from the following description when considered in conjunction with drawings, in which.

DETAILED DESCRIPTION OF THE PREFERRED EMBODIMENTS

Embodiment I

Figure 1:
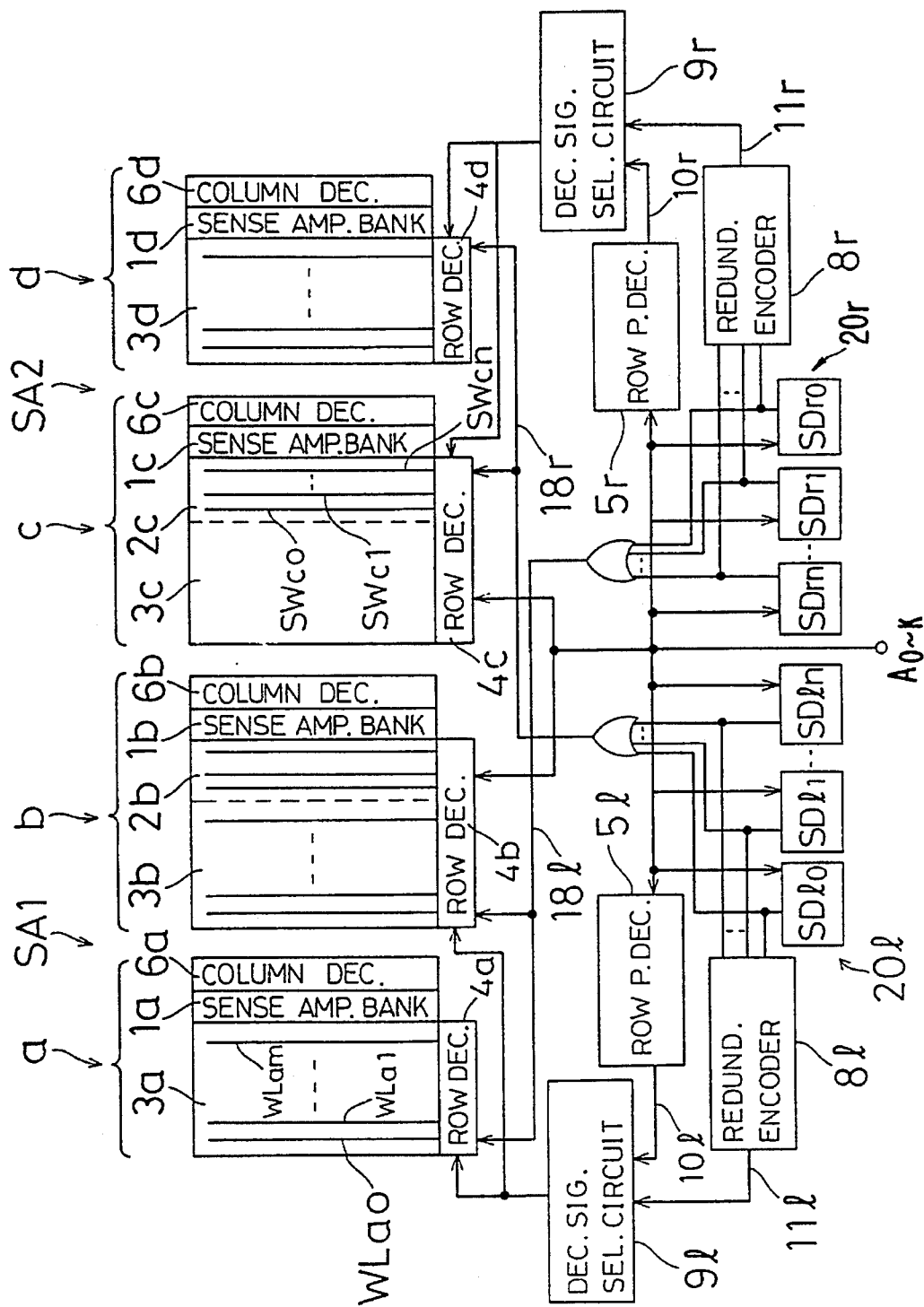
FIG. 1 is an electric circuit diagram showing how a semiconductor memory device of a first embodiment of the present invention is organized.

The first embodiment is now described by making reference to FIGS. 1 to 5. A semiconductor memory device with a redundant configuration in accordance with this embodiment has a plurality of primary memory cells each of which stores one bit of information, and a plurality of spare memory cells, wherein the whole memory cells are divided into two block groups SA1 and SA2. The block groups SA1 and SA2 are each divided into M memory cell blocks (i.e., 2M memory cell blocks (four memory cell blocks a, b, c, and d in this embodiment)). The memory cell block a (b, c, d) contains a sense amplifier array 1a (1b, 1c, 1d), a primary memory cell array 3a (3b, 3c, 3d), a row decoder 4a (4b, 4c, 4d), and a column decoder 6a (6b, 6c, 6d). In the centrally-located memory cell block b (c), a spare memory cell array 2b (2c) is provided which is located next to the primary memory cell array 3b (3c), and the row decoder 4b (4c) is integrated by connecting the primary memory cell to the spare memory cell with a shared decode line.

Row predecoders 5*l* and 5*r* are provided, which send out PREDECODE SIGNALS 10*l* (for the block group SA1) and 10*r* (for the block group SA2) respectively to select a primary memory cell corresponding to the address of ADDRESS SIGNAL input. Redundancy-use decision circuits 20*l* and 20*r* are provided, which store in advance the addresses of defective primary memory cells in each one of the primary memory cell arrays 3*a* to 3*d* to send out REDUNDANCY-USE SIGNAL if the address of ADDRESS SIGNAL agrees with the address of the defective primary memory cell stored. Redundancy encoders 8*l* and 8*r* are provided, which, upon receiving REDUNDANCY-USE SIGNALS from the redundancy-use decision circuits 20*l* and 20*r*, send out REDUNDANCY DECODE SIGNALS 11*l* and 11*r* to select redundancy memory cells. Further, decode signal selection circuits 9*l* and 9*r* are provided which select either the output of the row predecoders 5*l* and 5*r*, or the output of the redundancy encoders 8*l* and 8*r*.

The redundancy-use decision circuit 20*l* (20*r*) has elements SDl0 to SDln (elements SDr0 to SDrn), the number of which corresponds to the number of primary memory cells (16 primary memory cells here in this embodiment) to be disposed in the block group SA1 (the block group SA2). For example, the element SDl0 contains fuses the number of which corresponds to the number of addresses of the primary memory cells arranged in the block group SA2. If a defective memory cell is detected during the examination, a corresponding fuse to the address of the defective memory cell is opened up in advance. Therefore, the address of the defective memory cell can be stored.

If ADDRESS SIGNAL Ak is at a "0", this causes the row predecoder 5*l*, the redundancy-use decision circuit 20*r*, and the redundancy encoder 8*r* to operate. If ADDRESS SIGNAL Ak is at a "1", this causes the row predecoder 5*r*, the redundancy-use decision circuit 20*l*, and the redundancy encoder 8*l* to operate.

Figure 2:
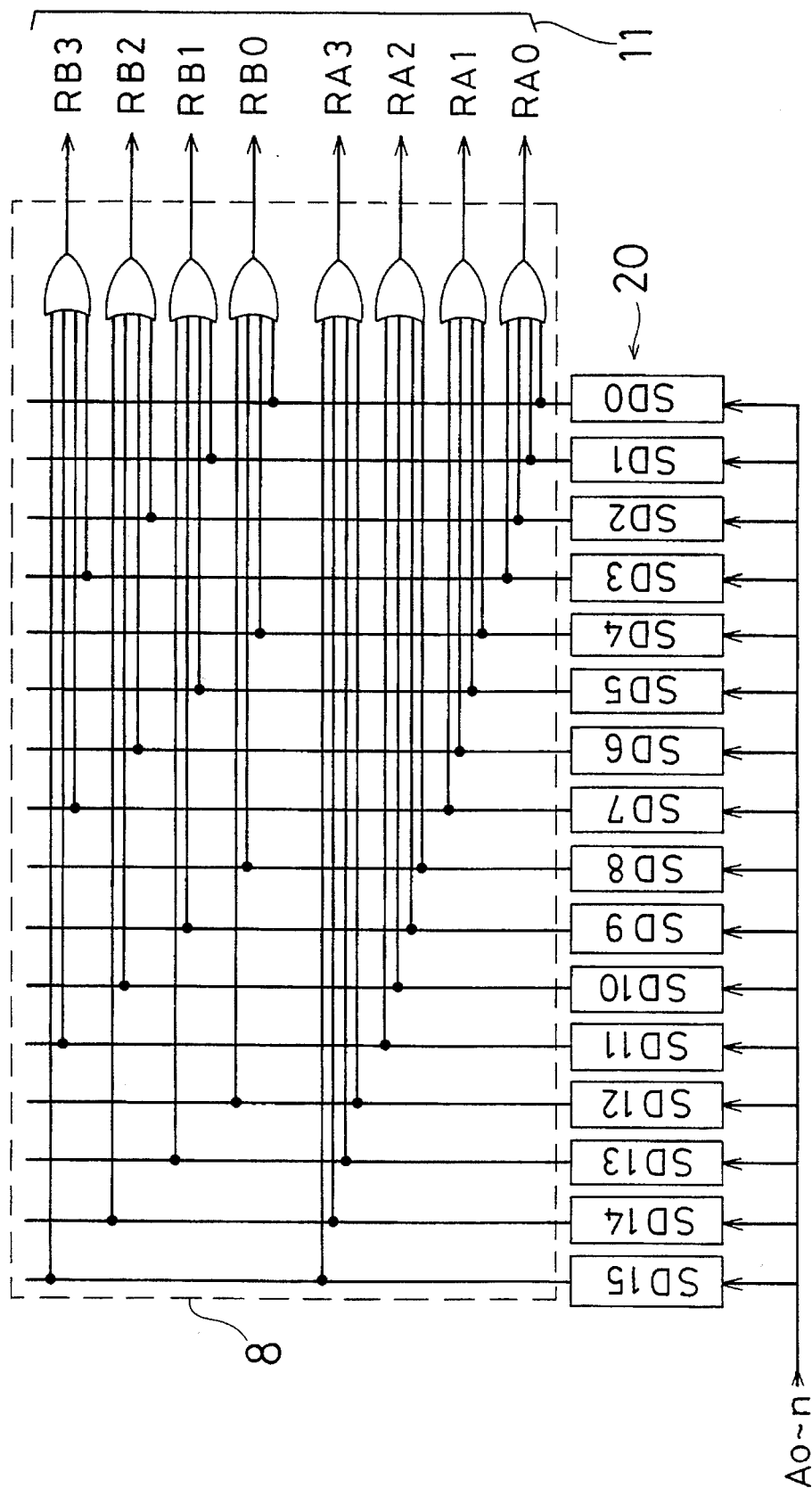
FIG. 2 is an electric circuit diagram of a redundancy encoder of the first embodiment.

The organization of the redundancy encoder 8 is explained by reference to FIG. 2. Note that the redundancy encoder 8*l* is organized in basically the same manner that the redundancy encoder 8*r* is organized. As show in the figure, the output of 16 elements SD0 to SD15 of the redundancy-use decision circuit 20 receiving ADDRESS SIGNALS A0 to An are translated into REDUNDANCY DECODE SIGNAL 11 comprised of 4×4 MATRIX SIGNALS RA0 to RA3, RB0 to RB3.

The decode signal selection circuit 9*l* is supplied with PREDECODE SIGNAL 10*l* from the row predecoder 5*l*, and with REDUNDANCY DECODE SIGNAL 11*l* from the redundancy encoder 8*l*. The decode signal selection circuit 9*r*, on the other hand, is supplied with PREDECODE SIGNAL 10*r* from the row predecoder 5*r*, and with REDUNDANCY DECODE SIGNAL 11*r* from the redundancy encoder 8*r*. Then, these PREDECODE SIGNALS 10*l* and 10*r*, fed from the row predecoders 5*l* and 5*r*, are supplied to the row decoders of one of the block groups SA1 and SA2 that contains the primary memory cell whose address corresponds to the input address, while on the other hand, the outputs of the redundancy encoders 8*l* and 8*r*, that is, REDUNDANCY DECODE SIGNALS 11*l* and 11*r* are fed to the row decoders belonging to the other block group that contains no primary memory cell whose address corresponds to the input address. In this embodiment, if ADDRESS SIGNAL Ak is at a "0", the decode signal selection circuit 9*l* supplies the row decoders 4*a* and 4*b* with PREDECODE SIGNAL 10*l* and the decode signal selection circuit 9*r* supplies the row decoders 4*c* and 4*d* with REDUNDANCY DECODE SIGNAL 11*r*. On the other hand, if ADDRESS SIGNAL Ak is at a "1", the decode signal selection circuit 9*l* supplies the row decoders 4*a* and 4*b* with REDUNDANCY DECODE SIGNAL 11*l* and the decode signal selection circuit 9*r* supplies the row decoders 4*c* and 4*d* with PREDECODE SIGNAL 10*r*.

Figure 3:
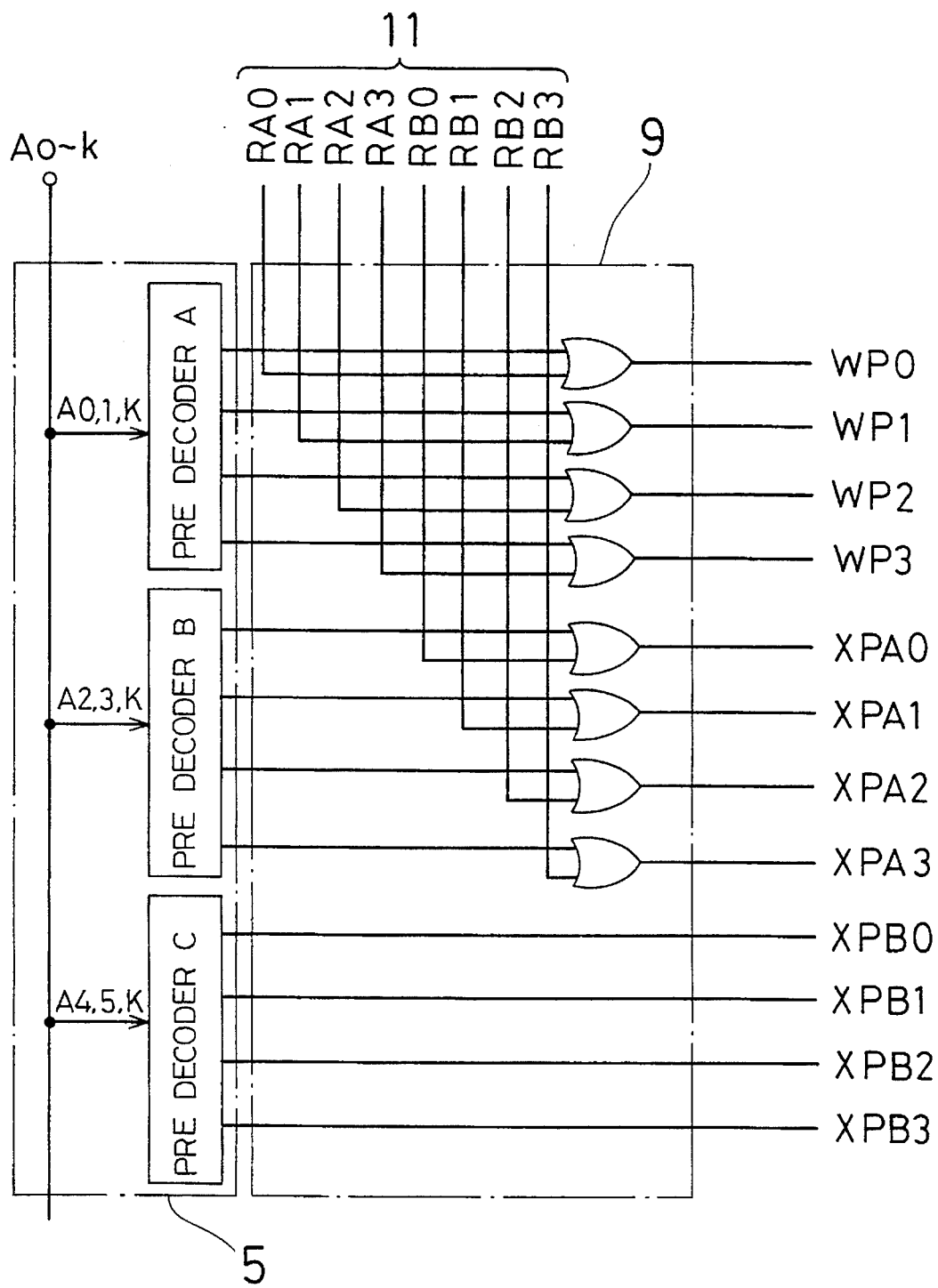
FIG. 3 is an electric circuit diagram showing how a predecoder and a decode signal selection circuit of the first embodiment are organized.

The organization of the row predecoder 5, together with that of the decode signal selection circuit 9, is now described with reference to FIG. 3. Note that the row predecoders 5*l* and 5*r* have basically the same organization, and that the decode signal selection circuits 9*l* and 9*r* have basically the same organization. As shown in FIG. 3, the row predecoder 5 is made up of three predecoders A, B and C. These predecoders are each provided with four decode lines. The decode lines of the predecoder A are combined with the decode lines receiving REDUNDANCY DECODE SIGNAL 11*l* (MATRIX SIGNALS RA0 to RA3), at each OR gate so that SIGNALS WP0 to WP3 that select primary word lines are sent out. The decode lines of the predecoder B are combined with the decode lines receiving REDUNDANCY DECODE SIGNAL 11*r* (MATRIX SIGNALS RB0 to RB3), at each OR gate so that FIRST GATE VOLTAGE APPLICATION SIGNALS XPA0 to XPA3 are sent out. Through the decode lines of the predecoder C, SECOND GATE VOLTAGE APPLICATION SIGNALS XPB0 to XPB3 are sent out.

Figure 4:
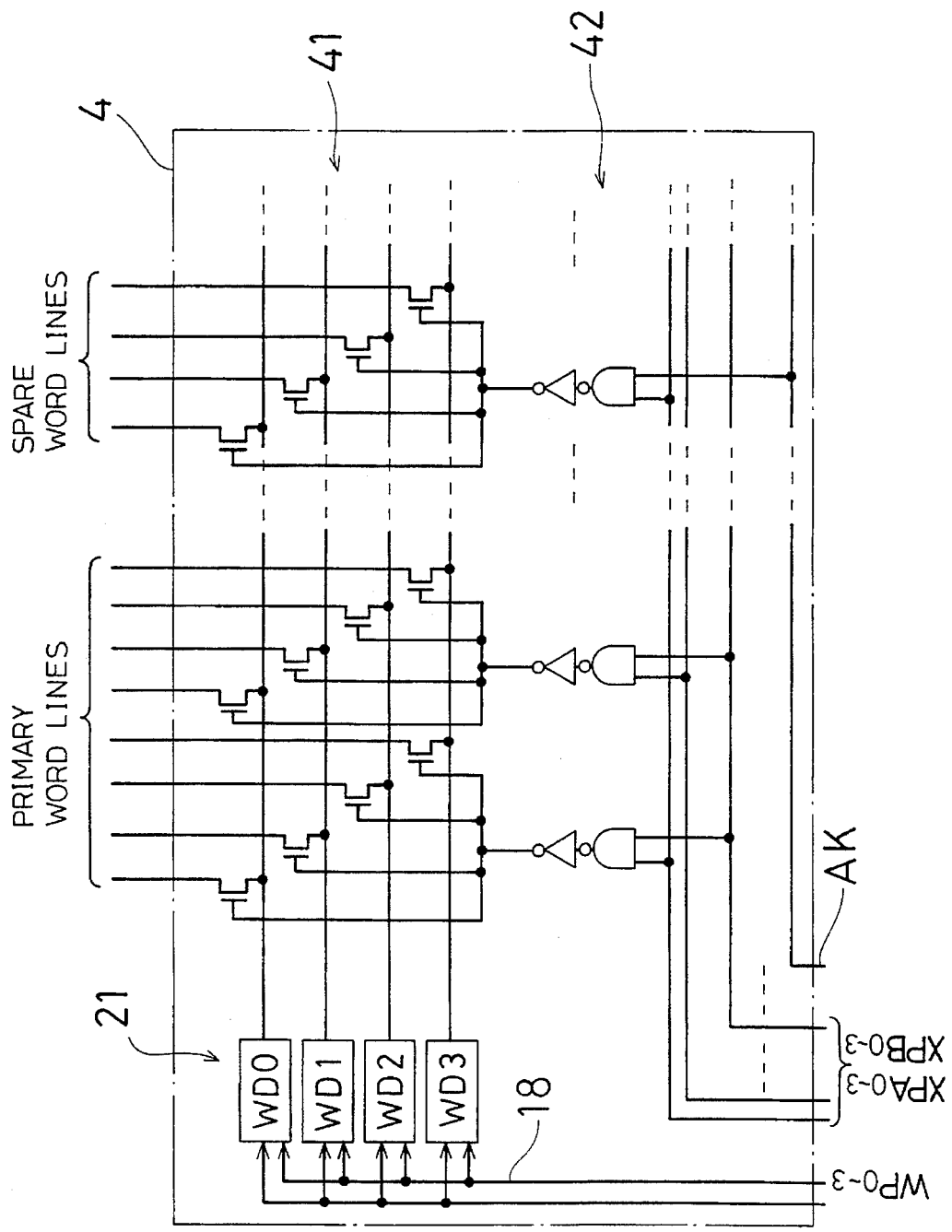
FIG. 4 is an electric circuit diagram illustrating how a row decoder of the first embodiment is organized.
Figure 5:
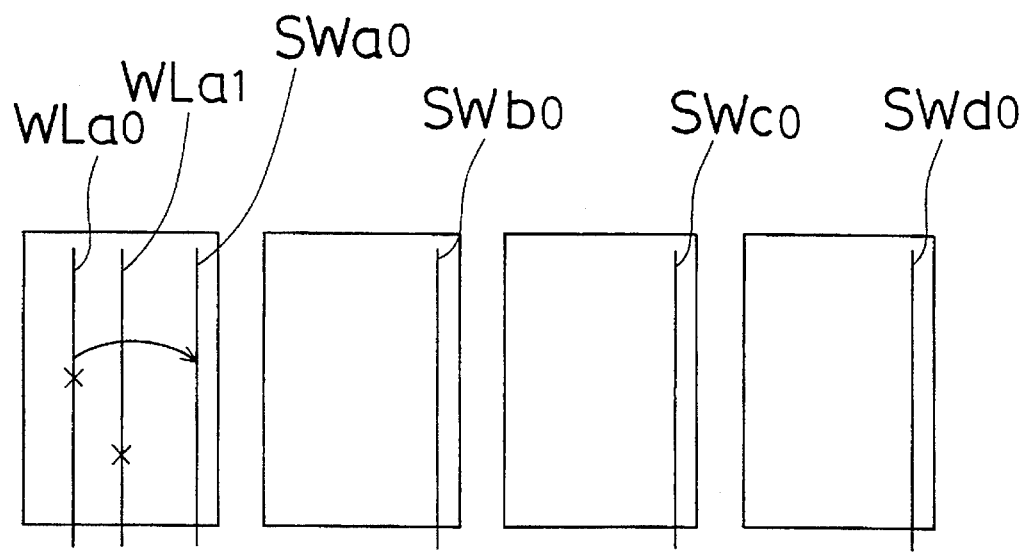
FIGS. 5(a) and 5(b) compare a corrective method of the first embodiment with a conventional corrective method.
Figure 5:
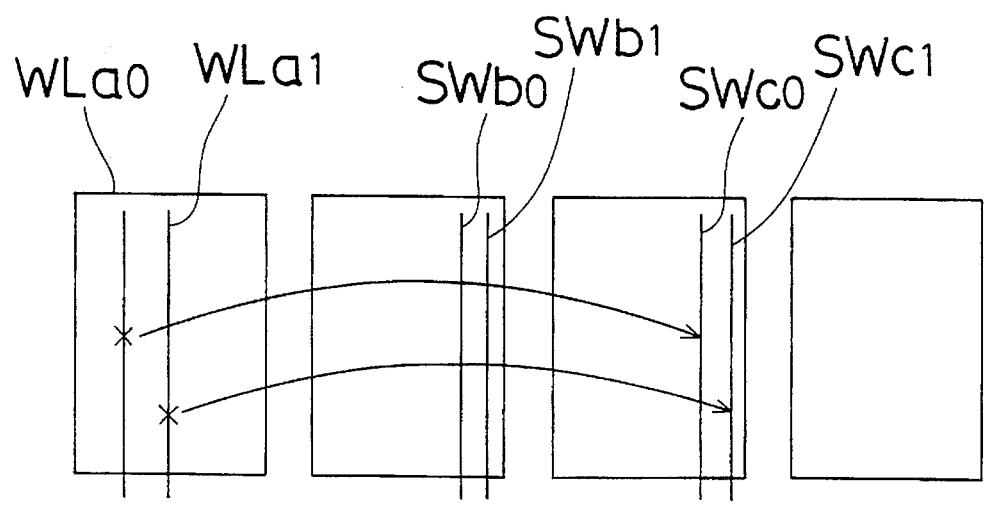
Figure 10:
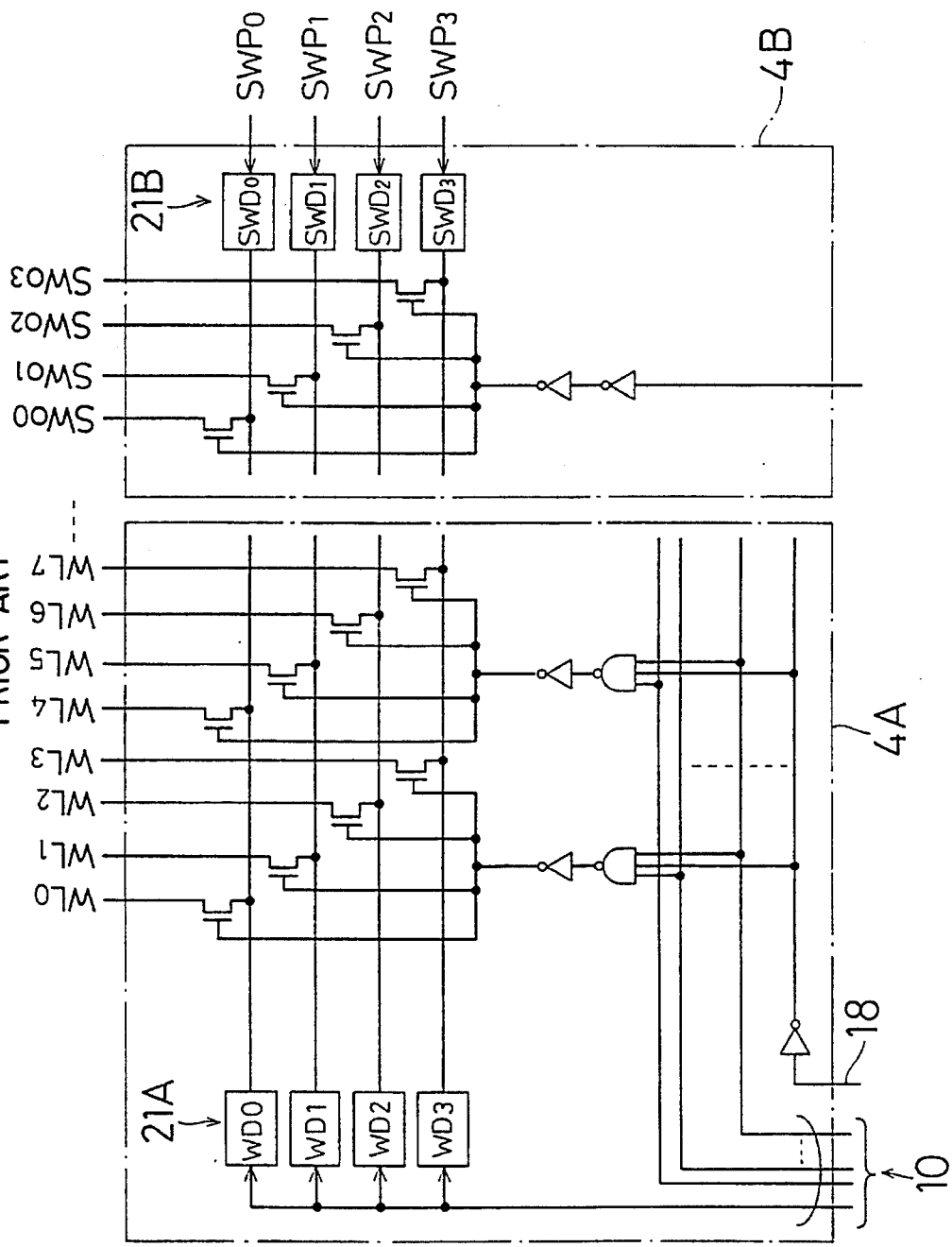
FIG. 10 is an electric circuit diagram showing the organization of a conventional row decoder.
Figure 11:
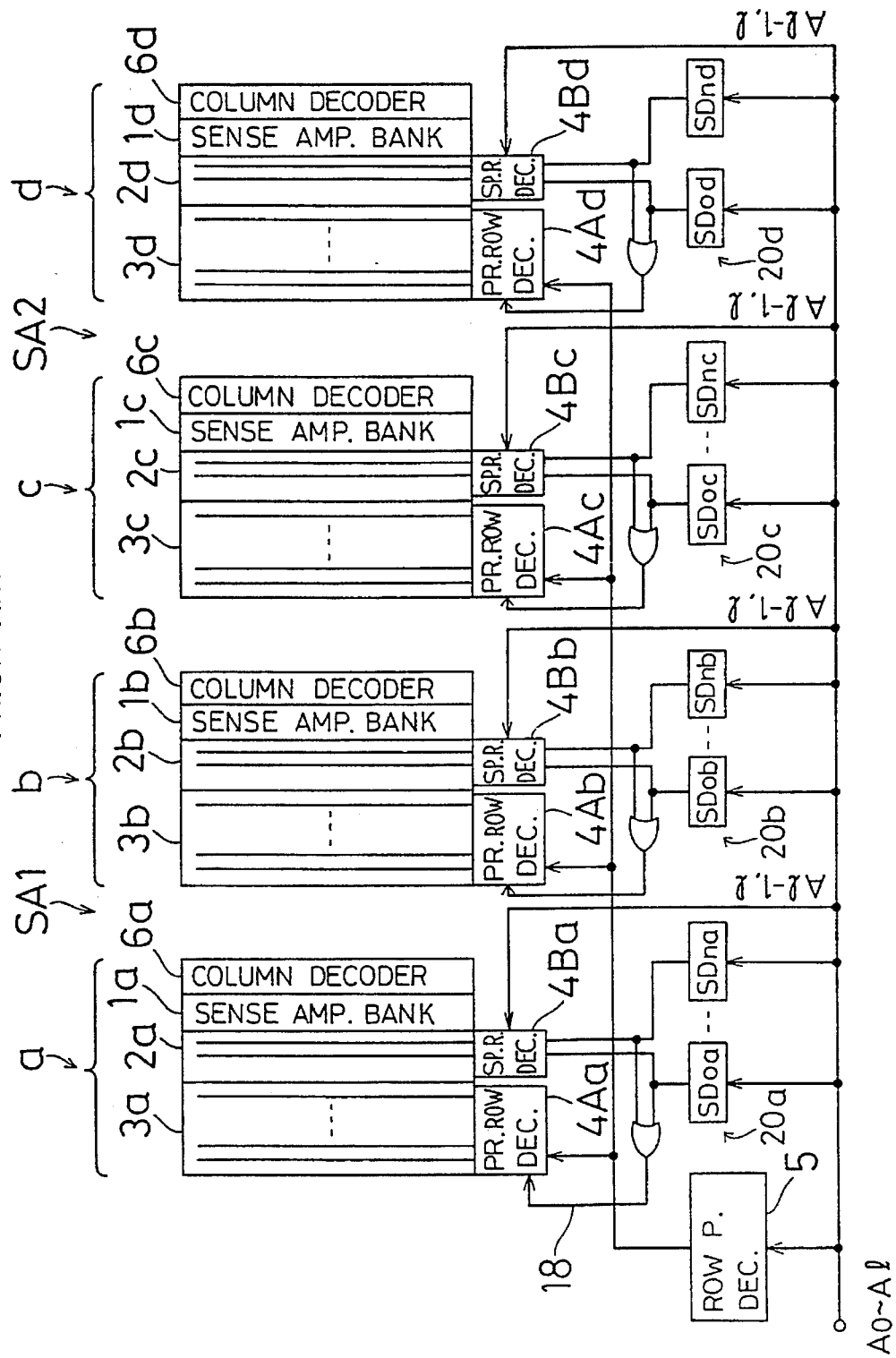
FIG. 11 is an electric circuit diagram showing the organization of a conventional semiconductor memory device with plural memory cell blocks.

Reference is now made to FIG. 4 to describe the organization of the row decoder 4 that is disposed either in the memory cell block b or in the memory cell block c. The row decoder 4 contains a decoder circuit 4*l* in which transistors used to drive the word lines of the primary memory cell array and transistors used to drive the word lines of the spare memory cell array are both arranged in a matrix manner, a word line drive signal generating circuit 21, comprised of elements WD0 to WD3 that send out DRIVE SIGNALS to the decode circuit 41, AND gates 193, and a gate voltage switching circuit 42 that switches, between a "1" and a "0", respective gate voltages of each one of the transistors of the decode circuit 41. The word lines of the primary memory cell array and the word lines of thee spare memory cell array are connected to the word line drive signal generating circuit 21, through shared decode lines. With this arrangement, at the time when the redundancy is being selected, decode signal lines WP0 to WP3 are each supplied with REDUNDANCY DECODE SIGNAL, and at the time when the primary word line is being selected, the WP0 to WP3 are each supplied with PREDECODE SIGNAL. This eliminates a need for the separate provision of a redundancy word line drive signal generating circuit and a primary word line drive signal generating circuit (see FIG. 10).

The operation of a semiconductor memory device having the above-described organization is explained. It is here assumed that a primary word line WLa0 of the memory cell block a contains a defective memory cell, and that the WLa0 is replaced by a spare word line SWc0 of the memory cell block c. An address corresponding to the primary word line WLa0 is pre-stored in the element SDr0 of the redundancy-use decision circuit 20*r*.

ADDRESS SIGNAL (A0 to Ak) corresponding to the primary word line WLa0 is first fed to the row predecoders 5*l* and 5*r* as well as to the redundancy-use decision circuits 20*l* and 20*r*. The row predecoder 5*l* and the decision circuit 20*r* will operate if ADDRESS SIGNAL Ak is at a "0". The addresses of the defective memory cells, which are stored in the elements SDr0 to SDrn of the decision circuit 20, are individually compared with this ADDRESS SIGNAL. If the address of ADDRESS SIGNAL input corresponds to the word line WLa0 of the defective memory cell, the element SDr0 of the decision circuit 20 sends out REDUNDANCY SELECTION SIGNAL SWD0. The redundancy encoder 8r sends out SIGNALS RA0 and RB0 as REDUNDANCY DECODE SIGNAL.

The input of the predecoders A to C of the row predecoder 5r becomes a "0". Of REDUNDANCY DECODE SIGNAL 11r only SIGNALS RA0 and RB0 are supplied at a "1". Accordingly, in the decode signal selection circuit 9r, only PREDECODE SIGNAL WP0 and FIRST GATE VOLTAGE APPLICATION SIGNAL XPA0 become a "1". In the row decoder 4r, shown in FIG. 4, a voltage is applied to the element WD0 of the word line drive signal generating circuit 21, and through the AND gates only the spare word lines become a "1", as a whole. From among the spare word lines, a spare word line SWa, which corresponds to the element WD0, is selected.

In the row predecoder 5l and the decode signal selection circuit 91, if ADDRESS SIGNAL Ak is at a "0", the input of the predecoders A to C of the row predecoder 5l becomes a "1". Then the predecoder A sends out, according to the address of the WL0, the predecode signal WP0, the predecoder B sends out FIRST GATE VOLTAGE APPLICATION SIGNAL XAP0, and the predecoder C sends out SECOND GATE VOLTAGE APPLICATION SIGNAL XPB0. In the row decoder 41, the input of the word line drive signal generating circuit 2l becomes a "1" and the output of the leftmost AND gate becomes a "1". Thus, no spare word lines are selected but the primary word line WLa0 is selected. However, if the element SDr0 of the redundancy-use decision circuit 20 sends out REDUNDANCY-USE SIGNAL (i.e., PRIMARY MEMORY STOP SIGNAL 181), no primary memory cells will be accessed since the primary word line drive signal generating circuit 2l is not operating now.

In accordance with the foregoing operation, the spare word line SWc0 is selected if the primary word line WLa0 contains a defective memory cell. In this way, the word line WLa0 where a defective memory cell is existent is replaced by the spare word line SWc0 to correct the defective memory cell.

As described above, this embodiment makes it possible to replace a primary word line, through which a defective memory cell is accessed, with a spare word line in one of memory cell blocks, whereby the defective word line corrective efficiency becomes increasingly improved, which is shown in FIG. 5a (showing prior art) and FIG. 5b (present invention). In both the prior art and the present invention, the number of spare word lines is four. If, in a certain memory chip, the primary word lines WLa0 and WLa1 of the memory cell block a each contain a defective memory cell, the prior art technique of FIG. 5a is able to correct only the WLa0 by replacing it with the spare word line SWa0 but is unable to correct the WLa1 because there are no spare word lines left in the memory cell block a. As a result, this memory chip becomes defective. Conversely, in accordance with the present invention of FIG. 5b, it is possible to replace any primary word line of the memory cell blocks a and b either with the spare word line SWc0 or with the spare word line SWc1. Thus, as shown in the figure, it is possible for the WLa0 to be replaced by the SWc0, and for the WLa1 by the SWc1. Even if a plurality of defective memory cells are found in one memory cell block in a memory chip, such a memory chip is immune from being defective. The corrective efficiency can be improved, accordingly.

If primary word lines and spare word lines are provided in one memory cell block, as in the conventional redundant system, this may cause a double-selection (that is, a primary word line and a spare word line are selected at the same time resulting in destroying read data) unless the spare word line is selected after PRIMARY MEMORY STOP SIGNAL is generated, the row decoder comes to a stop, and the primary word line becomes non-selective. Therefore, the primary word line must be activated after; the completion of redundancy-use decision, and the spare word line must be activated after inhibiting the primary word line. This prolongs access time. In the first embodiment, on the other hand, primary word lines and corresponding spare word lines are provided in different memory cell blocks, so that even if the simultaneous selection of a primary word line and a spare word line takes place, this will not destroy read data. Therefore, the spare word line and the primary word line can be activated, regardless of mutual timing. A high-speed word line activation can be accomplished, accordingly.

In this embodiment, the decode signal selection circuits 9l and 9r are used to feed REDUNDANCY DECODE SIGNAL for selecting the spare word lines SWb0 to SWbn, SWc0 to SWcn to a signal line shared with PREDECODE SIGNAL for selecting the primary word lines WLb1 to WLbm, WLc1 to WLcm. The word line drive signal generating circuit 2l is shared. This therefore eliminates needs for the separate provision of primary decode lines and redundancy decode lines, and for the separate provision of a primary word line drive signal generating circuit and a redundancy;word line drive signal generating circuit. The area of the memory chip can be reduced, in other words, a larger scale integration of semiconductor memory devices can be achieved.

As a means for replacing a defective memory cell with a spare memory cell, the redundancy-use decision circuits 20l and 20r, the row predecoder 5l and 5r, and the decode signal selection circuits 9l and 9r are provided. This allows the row decoders 4a to 4d of the memory cell blocks a to d to operate efficiently, and a word line corresponding to the address of ADDRESS SIGNAL can be driven without increasing the memory chip area.

For a 64-megabit DRAM, for example, if the total numbers of spare word lines per chip are the same, the invention can be expected to roughly have a double improvement in yield over the conventional redundant system. For a 1-gigabit DRAM, the present invention can be expected to have a five-fold improvement in yield as compared with the conventional redundant system.

For a 64-megabit DRAM, the conventional redundancy system, in order to obtain the same yield as the present redundancy system, requires a chip area approximately 5 mm$^2$ greater than that required by the present redundancy system, and as to a 1-gigabit DRAM, the conventional redundant system requires a chip area about 15 mm$^2$ greater than that required by the present redundancy system.

The provision of the redundancy encoders 8l and 8r can reduce the number of signal lines for redundancy decode signals. For example, as shown in FIG. 2, only eight redundancy decode lines, used to connect MATRIX SIGNALS RA0 to RA3, RB0 to RB3 to 16 REDUNDANCY-USE SIGNALS, are required.

The first embodiment has been described taking a DRAM with four memory cell blocks as an example, which is not to be considered restrictive. DRAMs, of other types, with a different number of memory cell blocks may be available.

Because of encoding by the redundancy encoders 8l and 8r, even in the organization of the first embodiment, the decode signal selection circuit 9 is used to feed REDUN- DANCY DECODE SIGNAL for selecting a great number of spare word lines to a signal line shared with PREDECODE SIGNAL to share a word line drive signal generating circuit. This effectively produces a chip area reducing effect.

In the first embodiment, two of the four memory cell blocks located inside contain spare word lines. The variation in memory cell processing is more likely to appear at the outside of a chip than the inside. If a memory cell block with a shorter bit line length including only primary word lines is arranged outside, and a memory cell block with a longer bit line length including spare word line is arranged inside (for instance, arranged around the center of a memory cell array), this realizes a semiconductor memory device that has a long data hold time and a tougher noise-resistance.

As described above, the generation of PRIMARY MEMORY STOP SIGNAL 18 brings the operation of the row decoder 4 to a halt. Therefore, no currents are required for selecting and activating the primary word line WL, resulting in achieving less power consumption. Further, since it is unnecessary to get the primary word line WL activated after redundancy-use decision is completed and PRIMARY MEMORY STOP SIGNAL 18 is established, there are no possibilities of a drop in operation speed.

Embodiment II

The second embodiment is now described. In the first embodiment, if a primary memory cell in one memory cell array is found to be defective, the defective memory cell is replaced by a spare memory cell in the other memory cell array. Which is not to be considered restrictive. A defective primary memory cell may be replaced by a spare memory cell in the same memory cell array, and when all spare memory cells are used up a further defective memory cell may be replaced by a spare memory cell in a different memory cell array.

Figure 6:
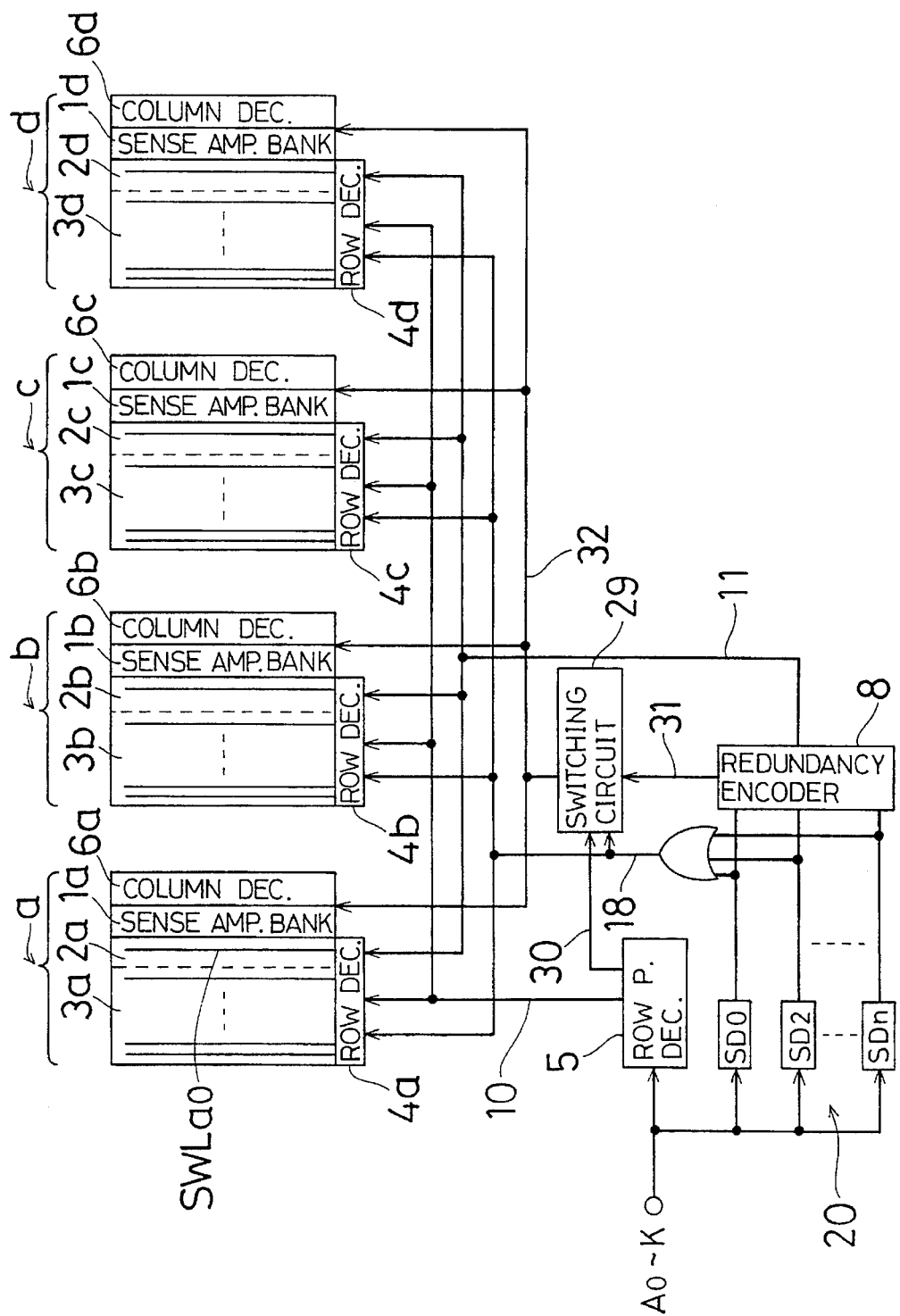
FIG. 6 is an electric circuit diagram showing how a semiconductor memory device of a second embodiment of the invention is organized.

FIG. 6 shows the organization of a semiconductor memory device in accordance with this embodiment. The memory cell blocks a to d have the primary memory cell arrays 3a to 3d respectively, and further have the spare memory cell arrays 2a to 2d respectively. The row predecoder 5, the redundancy-use decision circuit 20, comprised of the elements SD0 to SDn, the redundancy encoder 8, and a memory cell block selection switching circuit 29 are provided.

The operation of the semiconductor memory device of this embodiment is now described. Here, it is assumed that the element SD0 of the redundancy-use decision circuit 20 corresponds to the spare word line SWLa0 of the primary memory cell array 2a, and that an address, corresponding to a primary word line containing a defective memory cell, is stored in advance.

If input ADDRESS SIGNAL corresponds to the address of a primary word line containing no defective memory cells, the row predecoder 5 sends out PREDECODE SIGNAL 10 to select such a primary word line together with PRIMARY BLOCK SELECTION SIGNAL 30. Upon receiving PRIMARY BLOCK SELECTION SIGNAL 30, the block selection switching circuit 29 sends out BLOCK SELECTION SIGNAL 32. In this way, the primary word line is selected according to the input address. The redundancy-use decision circuit 20, on the other hand, sends out no REDUNDANCY-USE SIGNALS, since the stored address of the defective memory cell disagrees with the input address.

When ADDRESS SIGNAL corresponds to the address of a defective memory cell stored in the element SD0 of the decision circuit 20, the SD0 sends out REDUNDANCY-USE SIGNAL, and REDUNDANCY DECODE SIGNAL 11 to select the spare word line SWLa0 and REDUNDANCY BLOCK SELECTION SIGNAL 31 are supplied from the redundancy encoder 8. Further, PRIMARY MEMORY STOP SIGNAL 18 is fed to the row decoders 4a to 4d so that the primary word lines stop operating. Due to the input of PRIMARY MEMORY STOP SIGNAL 18, the block selection switching circuit 29 translates BLOCK SELECTION SIGNAL 32 from PRIMARY BLOCK SELECTION SIGNAL 30 into REDUNDANCY BLOCK SELECTION SIGNAL 31. Therefore, no primary word lines are subject to selection, the spare word line SWLa0 is selected, and the sense amplifier and the column decoder of the memory cell block a become activated by REDUNDANCY DECODE SIGNAL 11.

As described above, in accordance with the second embodiment, BLOCK SELECTION SIGNAL 32 is switched between PRIMARY BLOCK SELECTION SIGNAL 30 and REDUNDANCY BLOCK SELECTION SIGNAL 31 by the output Of the redundancy-use decision circuit 20. This makes it possible to replace a primary word line of any memory cell block with a spare word line of any memory cell block. For instance, a defective memory cell is replaced by a spare memory cell in the same memory cell block, and when all spare memory cell are used up a further defective memory cell will be replace by a spare memory cell in a different memory cell block. This results in increasingly improving the spare memory cell availability.

Embodiment III

Figure 7:
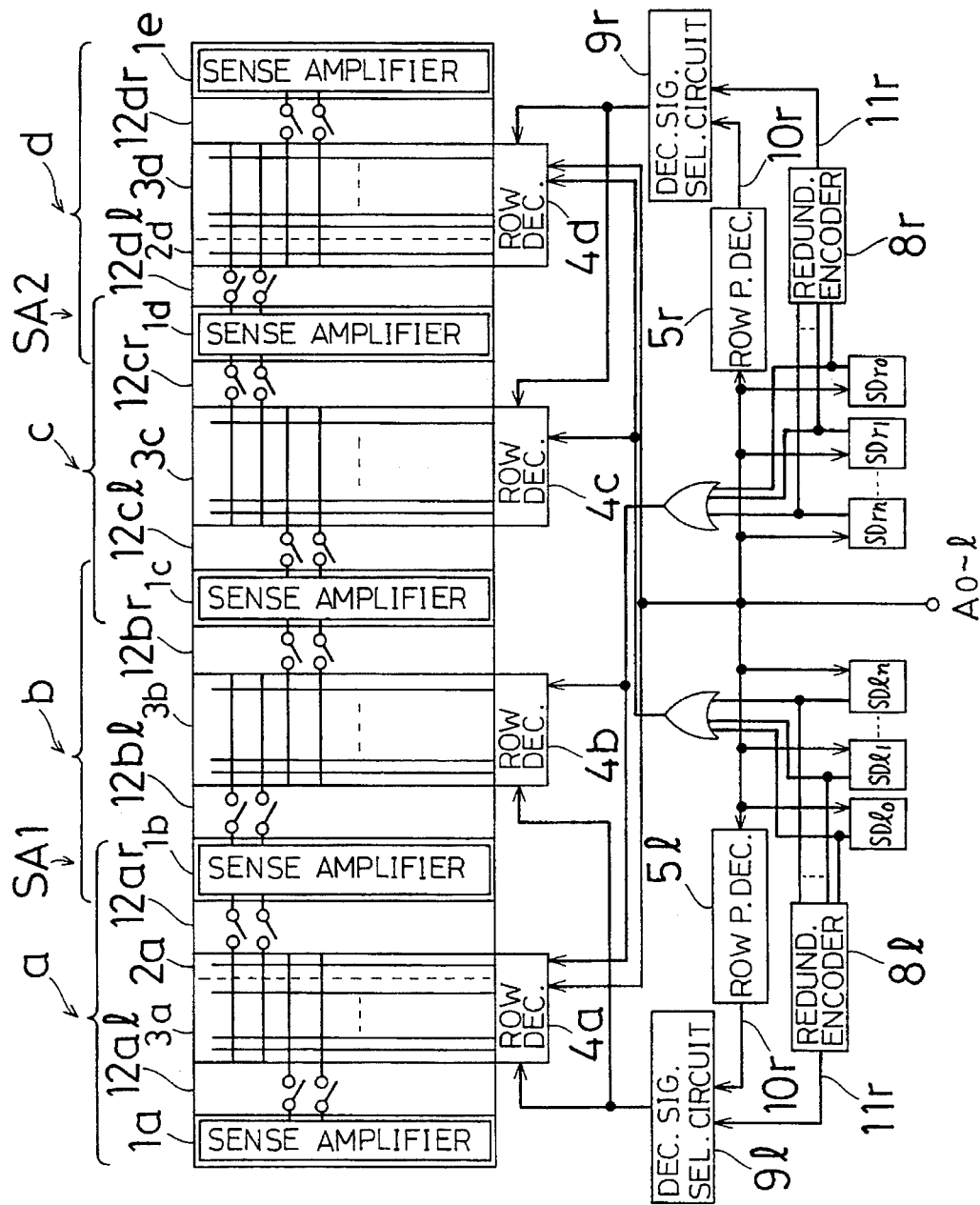
FIG. 7 is an electric circuit diagram showing how a semiconductor memory device of a third embodiment of the invention is organized.

The third embodiment is explained. FIG. 7 shows the organization of a semiconductor memory device according to this embodiment. This semiconductor memory device includes the memory cell blocks a to d, and the sense amplifiers 1a to 1e, wherein the adjoining memory cell blocks a and b share the sense amplifier 1b, the adjoining memory cell blocks b and c share the sense amplifier 1c, and the adjoining memory cell blocks c and d share the sense amplifier 1d. The memory cell block a (b, c, d) has the primary memory cell array 3a (3b, 3c, 3d). The leftmost and rightmost memory cell blocks a and d have the spare memory cell arrays 2a and 2d respectively. Further, the leftmost memory cell block a has the row decoder 4a that connects the primary memory cell array 3a to the spare memory cell array 2a with a shared decode line. Likewise, the rightmost memory cell block d has the row decoder 4d in which the primary memory cell array 3d and the spare memory cell array 2d are interconnected by a shared decode line. The central memory cell blocks b and c have the row decoders 4b and 4c respectively which decode the primary memory cell arrays 3b and 3c respectively.

Intervened between each one of the sense amplifiers 1a to 1e and each one of the memory cell arrays of the memory cell blocks a to d are block selection switch arrays 12al to 12dr. If a primary word line, contained in the primary memory cell array 3b, is selected, selection switches of the block selection switch arrays 12al and 12br are turned on, and switches of the block selection switch arrays 12ar and 12cl are turned off. At the same time, selection switches of the block selection switch arrays 12dl and 12dr, of the primary memory cell array 3d containing a spare word line corresponding to the selected memory cell block, are turned on, and switches of the block selection switch array 12cr are turned off. Other arrangements are the same as the first embodiment (see FIG. 1).

As seen from the above description, this embodiment can achieve the same remedy efficiency as the first embodiment. Additionally, the pitch of the sense amplifiers 1a to 1e can be reduced, and the number of sense amplifiers can be decreased. This results in a higher density of semiconductor memory devices per chip.

Embodiment IV

Figure 8:
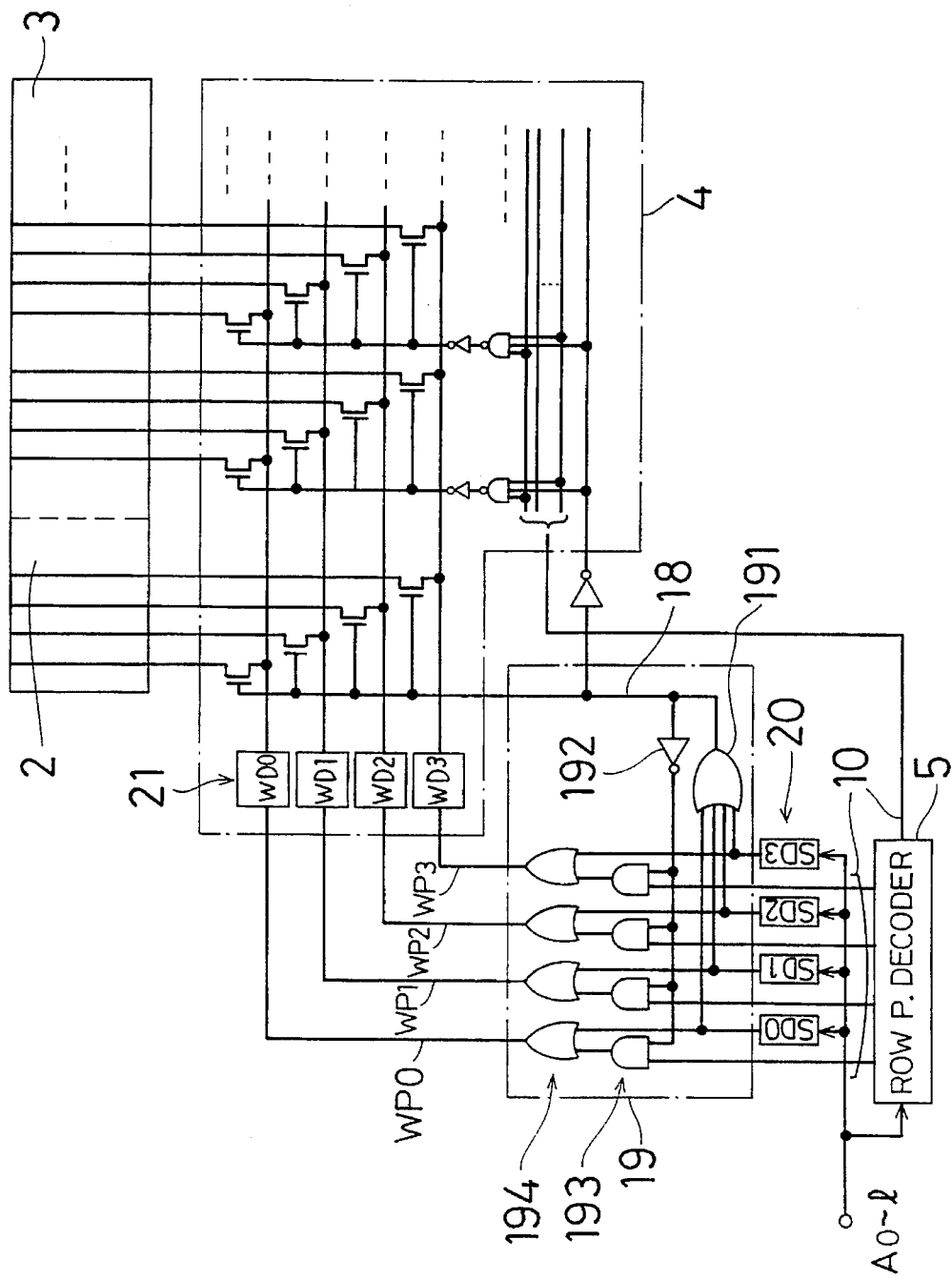
FIG. 8 is an electric circuit diagram showing how a semiconductor memory device of a fourth embodiment of the invention is organized.
Figure 9:
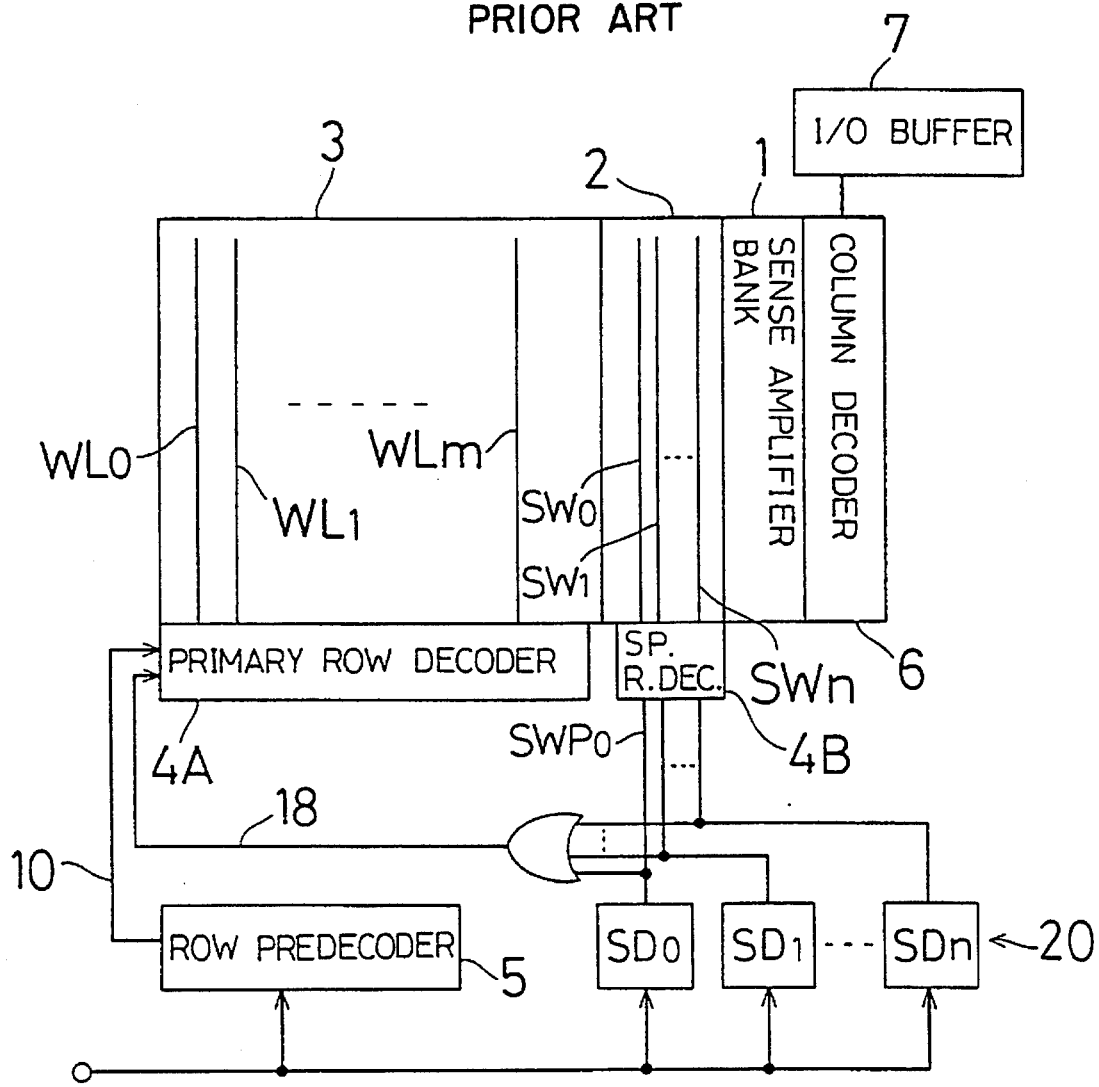
FIG. 9 is an electric circuit diagram showing the organization of a conventional semiconductor memory device.

The fourth embodiment is described making reference to FIG. 8. In this embodiment, both the spare memory cell array 2 and the primary memory cell array 3 are arranged in a single memory cell block, wherein the spare memory cell array 2 and the primary memory cell array 3 are connected by a shared decode line in the row decoder 4. The row decoder 4 contains the decode circuit 41 in which transistors used to drive the word lines of the primary memory cell array and transistors used to drive the word lines of the spare memory cell array are arranged in a matrix manner, the word line drive signal generating circuit 21, comprised of the elements WD0 to WD3 that send out DRIVE SIGNALS to the decode circuit 41, the AND gates, and the gate voltage switching circuit 42 that switches the respective gate voltages of each one of the primary word line drive transistors of the decode circuit 41, between a "1" and a "0". In other words, the word line of the primary memory cell array and the word line of the spare memory cell array are connected to the word line drive signal generating circuit 21, through a shared decode line.

In the semiconductor memory device of this embodiment, the row predecoder 5 to send out PRECODE SIGNAL 10 upon receiving ADDRESS SIGNAL, a decode signal switching circuit 19, and the redundancy-use decision circuit 20 comprised of the elements SD0 to SD3 are arranged. The decode signal switching circuit 19 is supplied with the outputs of the elements SD0 to SD3, and is made up of a stop signal output section 191, comprised of OR elements to send out PRIMARY MEMORY STOP SIGNAL 18 depending upon the operation of the elements SD0 to SD3 of the redundancy-use decision circuit 20, an inverter 192 to invert STOP SIGNAL 18 from the stop signal output section 191, an AND gate 193, comprised of four AND elements that are supplied with the output of the inverter 192 and with PREDECODE SIGNAL 10 fed from the row predecoder 5, and an OR gate 194, comprised of four OR elements that are supplied with the outputs of the elements SD0 to SD3 respectively. The output sides of the OR elements of the OR gate 194 are connected through the predecode lines WP0 to WP3 to the elements WD0 to WD3 of the word line drive signal generating circuit 21. Further, the output side of the stop signal output section 191 is connected directly to the gates of the spare word line drive transistors of the decode circuit 41 of the row decoder 4, and is also connected to the gates of the primary word line drive transistors, not directly but through inverters of the gate voltage switching circuit 42.

The operation of the semiconductor memory device described above is explained. The addresses of primary word lines containing defective memory cells are pre-stored in the elements SD0 to SD3 of the redundancy-use decision circuit 20.

If an address, which corresponds to a primary word line containing no defective memory cells, is supplied, the row predecoder 5 sends out PREDECODE SIGNAL 10 corresponding to the primary word line thus selected. Since the elements SD0 to SD3 do not send out signals at all if the input address disagrees with the stored address in these elements, the stop signal output section 191 sends out no PRIMARY MEMORY STOP SIGNAL 18. Therefore, the output of the inverter 192 becomes a "1". In the AND gate 193, only the AND elements that are supplied with PREDECODE SIGNAL 10 become a "1". The predecode lines WP0 to WP3 are supplied with PREDECODE SIGNAL 10 corresponding to the primary word line at the input address. Correspondingly, the elements WD0 to WD3 of the word line drive signal generating circuit 21 send out WORD LINE DRIVE SIGNAL. Meanwhile, since PRIMARY MEMORY STOP SIGNAL 18 is not fed from the stop signal output section 191, the gate voltages of the spare word line drive transistors each come to a "0" state. Thus, no spare word lines are selected. Of the outputs of the gate voltage switching circuit 42 the output of the AND gate 193, connected to a memory cell array at which the primary memory cell corresponding to PREDECODE SIGNAL 10 is placed, becomes a "1". Accordingly, the primary word line, which corresponds to ADDRESS SIGNAL input, is selected.

Next, the operation, at the time when a corresponding address to the address of a defective memory cell stored in the element SD0 of the redundancy-use decision circuit 20 is supplied, is now described. If an input address corresponds to the stored address of the element SD0, this causes the SD0 to send out REDUNDANCY-USE SIGNAL thereby causing the stop signal output section 191 to send out PRIMARY MEMORY STOP SIGNAL 18. All outputs from the gate voltage switching circuit 42 of the row decoder 4 become a "0", whereby no primary word lines are selected. Due to this PRIMARY MEMORY STOP SIGNAL 18, the AND gate 193 will not send out PREDECODE SIGNAL 10 but REDUNDANCY-USE SIGNAL, received from the element SD0 of the redundancy-use decision circuit 20, to the predecode line WP0. Because of PRIMARY MEMORY STOP SIGNAL 18 output from the stop signal output section 191, the gate voltages of the transistors connected to the word lines of the spare memory cell array 2 become a "1". This results in selecting the spare word line SWL0.

As described above, in this embodiment, the spare memory cell array 2 and the primary memory cell 3 are connected together with a shared decode line. This eliminates a need to provide a dedicated drive signal generating circuit for the spare word lines. The increase of the area of the memory chip due to the arrangement of spare memory cells can be avoided.

Additionally, in this embodiment, the number of elements of the redundancy-use decision circuit 20 and the number of decode lines of the word line drive signal generating circuit 21 are set even, so that the elements WD0 to WD3 of the circuit 21 can directly be selected by REDUNDANCY-USE SIGNALS from the elements SD0 to SD3 of the circuit 20. This advantageously simplifies the configuration for decoding a spare memory cell corresponding to the address of a defective memory cell.

However, if the decode lines of the word line drive signal generating circuit 21 is outnumbered by the elements of the redundancy-use decision circuit 20, a redundancy encoder should be provided (see FIG. 1) for translation to a matrix signal. In this case, a great number of spare memory cells can advantageously be arranged.

It is understood that various other modification to the above-described device will become evident to those skilled in the art. For that reason the arrangement described herein is for illustrative purposes only and is not to be considered restrictive.

The invention claimed is:

1. A semiconductor memory device with a plurality of primary memory cells and a plurality of spare memory cells, the semiconductor memory device comprising:

decoder means for interconnecting the primary memory cell and the spare memory cell through a shared decode line which is driven through a shared word line drive signal generating circuit; and memory replacement means coupled to said decoder means for storing in advance an address of a defective memory cell of the plurality of primary memory cells and makes, when an address signal corresponding to a memory cell to be accessed agrees with the address of the defective memory cell, the decoder means operates to select the spare memory cell to replace the defective primary memory cell.

2. A semiconductor memory device as in claim 1, wherein the memory replacement means includes:

a redundancy-use decision circuit that stores in advance the address of said defective memory cell and outputs a redundancy-use signal if the address signal agrees with the stored address;

a predecoder responsive to the address signal and sends out a predecode signal to select a word line of the primary memory cell corresponding to the address signal; and a decode signal switching circuit that connects the predecode signal, supplied from the predecoder, to the word line drive signal generating circuit, while on the other hand connecting, when said redundancy-use signal is sent out from the redundancy-use decision circuit, the redundancy-use signal instead of the predecode signal to the word line drive signal generating circuit.

3. A semiconductor memory device as in claim 2, further including:

a redundancy encoder that encodes the output of the redundancy-use decision circuit to send out a redundancy decode signal to select a word line of said spare memory cell.

4. A semiconductor memory device comprising:

a plurality of memory cell blocks each containing a plurality of memory cells, wherein a fraction of the memory cells of at least one of said memory cell blocks function as primary memory cells and the remaining memory cells function as spare memory cells, decoder means for accessing word lines of said primary and said spare memory cells of said at least one of said memory cell blocks, said decoder means comprising a plurality of decode lines for supplying a drive signal to said word lines of said primary and said spare memory cells, said word lines of said primary memory cells and spare memory cells are connected by a plurality of shared decode lines and are driven through a shared word line drive signal generation circuit, and memory replacement means for controlling said decoder means such that when a requested memory cell address corresponds to a defective primary memory cell the decoder means operates to select a spare memory cell selected to replace said defective primary memory cell, wherein said spare memory cell is defined to be selectable from a memory cell block other than the memory cell block containing said defective primary memory cell.

5. A semiconductor memory device as in claim 4, further including:

a decoder that individually drives word lines of the memory cells of each memory cell block;

a redundancy-use decision circuit that stores in advance the address of the defective primary memory cell and outputs a redundancy-use signal when an address signal corresponding to a memory cell to be accessed agrees with the stored address;

a predecoder responsive to the address signal and sends out a predecode signal to select a word line of the primary memory cell corresponding to the address signal; and a decode signal selection circuit that connects the predecode signal, supplied from the predecoder, to the decoder of the memory cell block containing the primary memory cell corresponding to the address signal while, when said redundancy-use signal is sent out from the redundancy-use decision circuit, connecting the redundancy-use signal to the decoder of the memory cell block containing therein said spare memory cell.

6. A semiconductor memory device as in claim 5, wherein:

the plurality of memory cell blocks are divided into two block groups;

the spare memory cells are arranged in any one of the memory cell blocks of the two block groups;

if a primary memory cell of one of the two block groups is a defective memory cell, a spare memory cell of the other block group is previously assigned for replacement; and the decode signal selection circuit connects predecode signals to the decoders of one of the block groups which contains the primary memory cell corresponding to the address signal, while connecting redundancy-use signals to the decoders of the other block group which contains the primary memory cell not corresponding to the address signal.

7. A semiconductor memory device as in claim 5, further including a redundancy encoder that encodes said redundancy-use signal fed from the redundancy-use decision circuit to send out a redundancy decode signal to select a word line of said spare memory cell.

8. A semiconductor memory device as in claim 5, further including:

stop signal output means that sends out, upon receiving said redundancy-use signal from the redundancy-use decision circuit, a primary memory cell stop signal to the decoder of said defective primary memory cell to stop the operation of the defective primary memory cell.

9. A semiconductor memory device as in claim 6, wherein:

the memory cell blocks are arranged in a row and are divided into two block groups by a boundary defined between the two centrally located memory cell blocks; and the memory cell block containing the spare memory cells is positioned at the center.

* * * * *